United States Patent [19]

Okumura

[11] Patent Number: 4,520,463
[45] Date of Patent: May 28, 1985

[54] MEMORY CIRCUIT

[75] Inventor: Kohichiro Okumura, Tokyo, Japan

[73] Assignee: Nippon Electric Co., Ltd., Tokyo, Japan

[21] Appl. No.: 436,898

[22] Filed: Oct. 26, 1982

[30] Foreign Application Priority Data

Oct. 27, 1981 [JP] Japan .................. 56-171679

[51] Int. Cl.³ ........................... G11C 11/40
[52] U.S. Cl. .................. 365/189; 365/227; 307/449
[58] Field of Search .......... 365/189, 230, 227; 307/449

[56] References Cited

U.S. PATENT DOCUMENTS 4,422,160 12/1983 Watanabe .................. 365/189

Primary Examiner—Terrell W. Fears
Attorney, Agent, or Firm—Sughrue, Mion, Zinn, Macpeak, and Seas

[57] ABSTRACT

A memory circuit having an improved address decoder which is operable with a low power consumption and can be fabricated at a high-integration is disclosed.

The memory comprises a logic means for decoding a part of address signals provided for a plurality of address lines of a memory cell array, and a plurality of transfer gates provided between the logic means and the address lines, in which one of those transfer gates is made enabled in response to a different part of the address signals thereby to transmit the output signal of the logic means to a selected row line through the enabled transfer gate.

11 Claims, 1 Drawing Figure

MEMORY CIRCUIT

The present invention relates to a memory circuit employing insulated-gate field effect transistors and, more particularly, to an address decoder circuit employed therein.

Accompanied with the recent tendency of increase in memory capacity of memory circuits, there are caused increase in the numbers of row lines and column lines forming memory cell matrix as well as increase in the number of the address input signals for selecting the memory cell matrix, which causes not only an increase in the number of decoders for selecting the memory cell matrix but also an increase in the number of the transistors constituting the respective decoders, resulting in a marvellous increase in the number of transistors employed by all decoders. In consequence, the decoders occupy an impractically large part of the area in the memory circuit to hinder the increase of scale of integration.

Read Only Memories (ROM) can be generally calssified into a synchronous type ROM has a relatively low operation speed although it requires small electric power consumption. To the contrary, the non-synchronous type ROM consumes a relatively large electric power although it can operate at a high speed. The recent tendency of increase in memory capacity of ROM has given a rise to a demand for smaller powder consumption of the decoder circuits which cause major part of the whole power consumption of ROM. To cope with this demand, it has been proposed to introduce a pwer down mode in order to reduce the power consumption of the non-synchronous type ROMs while making the most of the high speed operation of the non-synchronous type ROMs. Namely, this proposal is to introduce, in a decoder in which the output from a decode circuit such as NOR gate is delivered to the row lines through a buffer such as an inverter, a power down control signal so as to interrupt the direct current paths of the decode section and the buffer section of the decoder when the memory is not energized, thereby to reduce the power consumption of the decoder. According to this power down mode, however, the level of output to the row lines is held at the power source level (Vc) as a result of interruption of the direct current path. Therefore, when the operation mode is shifted from the power down mode to the energization mode, the level of the row lines other than the selected row line is changed from the power source level to the ground level. As a result, the potential of the column lines is drawn towards the negative side through the capacitance coupling between the row lines and column lines, often resulting in a malfunction or failure in high speed operation.

Accordingly, an object of the present invention is to provide a memory circuit with reduced power consumption.

Another object of the present invention is to provide a memory circuit capable of operating at a high speed without causing any malfunction.

In the present invention, a plurality of row lines are associated to a decoder circuit through transfer gates respectively. The selecting and non-selecting operation of the decoder is controlled by a first group of address signals, while a second group of address signals is used for controlling the transfer gates. According to this arrangement, one of the decoders is selected by the first group of address signals, and one of the transfer gates associated to this selected decoder is selected by the second group of address signals, thereby to supply the desired row line with the selection level. Since the decoder which consumes the electric power is provided for a plurality of row lines commonly, the number of the decoders is reduced by an order of several tenths thereby to attain a remarkable reduction in the power consumption.

Furthermore, in the memory circuit of the present invention, clamp transistors are connected between the reference potential such as ground potential and the junctions between respective transfer gates and the row lines. By controlling the clamp transistors in a complementary manner to the corresponding transfer gates, the non-selected row lines are forcibly held at the reference potential so that any malfunction attributable to the non-selected row lines can be avoided.

According to the present invention, the above-mentioned transfer gate is preferably constituted by a depletion type field effect transistor having a threshold value approximating zero volt. According to such an arrangement, it is possible to efficiently transmit the output signal from the decoder to the selected row line without substantial level reduction. In this case, a voltage control circuit is connected between the clamp transistor and the reference voltage. When the memory is energized, the reference potential is delivered to the intermediate junction through the clamp transistor, whereas in the power down mode of the memory, a potential higher than the threshold value of the depletion transistor is given to the intermediate junction thereby to turn off the depletion type transistor to hold all of the row lines at the non-selection level in the power down mode of the memory.

According to the present invention, it is possible to obtain a memory circuit operable with reduced power consumption and capable of excluding any malfunction.

Furthermore, according to the present invention, it is possible to remarkably reduce the number of the transistors constituting the decoders, and hence a memory circuit can be fabricated at a high density.

According to one aspect of the present invention, there is provided a memory circuit comprising: a first circuit part including a first group of signals which takes the ground potential in the power down mode and have the respective levels determined by the address input information in the active state, and a multi-input NOR circuit which receives the first group of signals; a second circuit part adapted to receive the output from the first circuit part, the second circuit part acting as an inverter circuit in the active state while in the power down state, taking the ground level and consuming no electric power; a third circuit part including a first depletion type insulated gate field effect transistor having a drain connected to a constant voltage source and a gate connected to the output of the first circuit part and having a threshold voltage approximating zero volt, and a first enhancement type insulated gate field effect transistor having a drain connected to the source of the first depletion type transistor and constituting an output terminal and a gate connected to the output of the second circuit part and having a source which is grounded at least in the active state; a second group of signals which takes the ground level in the power down state and, while in the active state, only one selected by the address information takes the level of the aforementioned constant voltage source while others are grounded; a third group of signals in a complementary relation to the second group of signals; a plurality of second depletion type insulated gate field effect transistors having drains connected to the output terminal of the third circuit part, gates connected to corresponding signals of the second group and sources constituting the output terminals and having threshold voltages approximating zero volt; a plurality of second enhancement type field effect transistors having drains connected to the sources of the second depletion type insulated gate field effect transistors having threshold voltages approximating zero volt and gates connected to the signals of the third group; and means for holding the sources of the second enhancement type insulated gate field effect transistors at the ground level in the active state and, while in the power down state at a voltage slightly highly than the threshold voltage of the second depletion type insulated gate field effect transistors having threshold voltages approximating zero volt.

The following description of the preferred embodiment of the present invention will be made on an assumption that N-channel insulated gate field effect transistors (MOSFET) are used as the transistors and that a positive logic is used in which high and low levels correspond to "1" and "0", respectively.

The construction of the decoder of conventional memory circuit will be explained with reference to FIG. 1.

Figure 1:
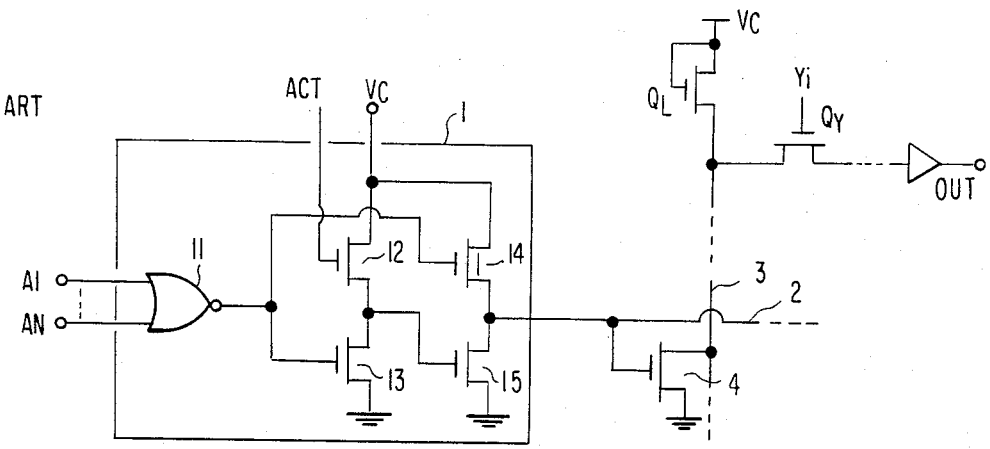
FIG. 1 is a circuit diagram of major part of a conventional memory circuit.

FIG. 1 shows one unit circuit of row decoders for driving a memory cell array constructed in the form of a matrix. The row decoder circuit includes: a NOR circuit 11 which receives address information signals $A_1$ to $A_N$ which are set by address informations in the active state and take the ground level in the power down state; an enhancement type MOSFET (referred to as E-MOSFET) 12 and an E-MOSFET 13 which are connected in series between the constant voltage power supply Vc and the ground; and a depletion type MOSFET (referred to as D-MOSFET) 14 and an E-MOSFET 15 which also are connected in series between the constant voltage source Vc and the ground. The output from the NOR circuit is connected to the gate of the E-MOSFET 13 and the gate of the D-MOSFET 14. A signal ACT supplied to the gate of the E-MOSFET 12 takes the Vc level in the active state and the ground level in the power down state. The junction between the E-MOSFET 12 and the E-MOSFET 13 are connected to the gate of the E-MOSFET 15, while the junction between D-MOSFET 14 and the E-MOSFET 15 constitutes the output of the row decoder circuit 1. The row decoder circuit 1 makes the selection in the row direction of the memory cell array arranged in the form of a matrix, and the selection of the column is made by another address information so that the information stored in a memory cell 4 at the crossing point of the matrix is read out. For instance, for reading the information on the crossing point between the row line 2 and the column line 3, the address information is so set that the output from the row decoder 1, i.e. the row line 2, takes the Vc level and the column line 3 is selected by another address information and is charged with electric charge. For instance, when the drain of the memory cell 4 is connected to the column line 3, the electric charge flows to the ground through the memory cell 4 so that the potential of the column 3 approximates the ground level. To the contrary, if the drawin of the memory cell 4 is not electrically connected to the column line, the potential of the column line 3 is at a high level because there is no electrical path for the electric charge to flow therethrough. It is, therefore, possible to read the information by detecting the potential of the column line 3 through the column selecting transistor Qr and a sense amplifier SA.

An explanation will be made hereinunder as to the operation of the row decoder circuit 1 shown in FIG. 1 which is an example of conventional row decoders. In the active state, i.e. when ACT takes the Vc level, the E-MOSFET 12 is turned on while E-MOSFET 13 operates as an inverter circuit. Therefore, when at least one of the address information signals $A_1$ to $A_N$ takes the Vc level, the output of the NOR circuit 11 takes the ground level, so that the output of the NOR circuit 11 takes the ground level. Consequently, the junction between the E-MOSFET 12 and the E-MOSFET 13 takes the Vc level, so that the output from the row decoder 1 takes the ground level and the column line 3 is not selected. When all of the address information signals $A_1$ to $A_N$ take the ground level, the output of the NOR circuit 11 takes the Vc level, so that the junction between the E-MOSFET 12 and the E-MOSFET 13 take the ground level. In consequence, the output from the line decoder circuit 1 takes the Vc level so that the line 2 is selected. In the power down state, i.e. when the ACT takes the ground level, all of the address information signals $A_1$ to $A_N$ take the ground level, so that the output from the NOR circuit 11 takes the Vc level. Consequently, the junction between the E-MOSFET 12 and the E-MOSFET 13 take the ground level, so that the junction between the D-MOSFET 14 and the E-MOSFET 15, i.e. the output from the row decoder 1, takes the Vc level. Under this state, partly because all of the address information signals A to $A_N$ take the ground level and partly because the E-MOSFET 12 and the E-MOSFET 15 have been turned off, the power consumption of the line decoder circuit 1 as a whole is reduced to zero.

The conventional row decoder circuit shown in FIG. 1 takes, in the active state, a form of a NOR circuit and a push-pull circuit thereby to reduce the power consumption. When N bits of address information signals are employed, the electric power consumption is considerably large because the electric current flows through $(2^N - 1)$ pieces of NOR circuits, one series circuit constituted by an E-MOSFET 12 and and E-MOSFET 13, and $(2^N - 1)$ pieces of series circuit of D-MOSFET 14 and E-MOSFET 15. By setting the threshold voltage of the D-MOSFET 14 at a level approximating zero volt, it is possible to reduce the electric current in the $(2^N - 1)$ pieces of series circuit D-MOSFET 14 and E-MOSFET 15 to a negligibly small level. However, there is no means for reducing the power consumption in the $(2^N - 1)$ pieces of NOR circuit. The power consumption by the row decoder circuit, therefore, is increased in proportion to the increase of the capacity of the memory. In the conventional circuit shown in FIG. 1, the output of the row decoder circuit 1, i.e. the row line 2, takes the Vc level in the power down state. However, as the mode is changed from the power down state to the active state, the potential of ($2^N-1$) pieces of row decoders other than the selected one, are lowered to the ground level, while drawing the potential of the column line 3 towards the negative side by capacitive coupling through the gate insulating film of the memory cell 4, often resulting in a malfunction or obstruction of the high-speed operation. Therefore, the use of the conventional row decoder circuit shown in FIG. 1, which provides an output of Vc level in the power down state, is not preferred.

A preferred embodiment of the present invention will be described hereinafter with reference to FIG. 2. Similarly to FIG. 1, explanation will be made on one unit circuit 2-1 of the row decoders. In contrast to the conventional circuit shown in FIG. 1 in which each unit has one row line, one unit of the row decoder of the invention has four row lines. In other words, one decoder is provided for every four row lines. The row decoder circuit 10 includes: an (N−2) input NOR circuit 101 adapted to receive address information signals $A_1$ to $A_{N-2}$ which are set by the address information in the active state and held at the ground level in the power down state; an E-MOSFET 102 and an E-MOSFET 103 connected in series between the constant voltage source Vc and the ground; a depletion type MOSFET having a threshold voltage of approximately zero volt (Shallow depletion MOSFET, referred to as "SD-MOSFET", hereinunder) 104 and an E-MOSFET 105 which are also connected in series between the constant voltage source Vc and the ground; SD-MOSFETs 106, 107, 108 and 109 connected at their drains to the junction between the SD-MOSFET 104 and the E-MOSFET 105 and receiving signals $B_1$, $B_2$, $B_3$ and $B_4$ at their gates; an E-MOSFET 110 connected at its drain to the source of the SD-MOSFET 106 and receiving at its gate a signal $\overline{B_1}$ which is complementary to the aforementioned signal $B_1$; an E-MOSFET 111 connected at its drain to the source of SD-MOSFET 107 and receiving at its gate a signal $\overline{B_2}$ complementary to the aforementioned signal $B_2$; an E-MOSFET 112 connected at its drain to the source of the SD-MOSFET 108 and receiving at its gate a signal $\overline{B_3}$ complementary to the aforementioned signal $B_3$; an E-MOSFET 113 connected at its drain to the source of the SD-MOSFET 109 and receiving at its gate a signal $\overline{B_4}$ complementary to the aforementioned signal $B_4$; and a biasing circuit connected to the sources of the E-MOSFETs 110, 111, 112 and 113, the biasing circuit being adapted to reduce the potentials of the sources of the E-MOSFETs 110, 111, 112 and 113 to the ground level in the active state and, in the power down state, sets the source voltage of the E-MOSFETs 110, 111, 112, and 113 at a level higher than the threshold voltage of the SD-MOSFETs. The output from the multi-input NOR circuit 101 is connected to the gate of the E-MOSFET 103 and the gate of the E-MOSFET 104. The junction between the E-MOSFET 102 and the E-MOSFET 103 is connected to the gate of the E-MOSFET 105. The gate of the E-MOSFET 102 receives a signal ACT which takes the Vc level in the active state and the ground level in the power down state. Signals $B_1$, $B_2$, $B_3$ and $B_4$ and their complementary signals $\overline{B_1}$, $\overline{B_2}$, $\overline{B_3}$ and $\overline{B_4}$ are decoded by two address information signals $A_{N-1}$ and $A_N$ other than those $A_1$ to $A_{N-2}$. In the active state, one of four signals $B_1$ to $B_4$ takes the Vc level while the remainder three signals take the ground level. In the active state, only one of them takes the ground level, while other three signals take the Vc level. In the power down state, the signals $B_1$ to $B_4$ take the ground level while $\overline{B_1}$ to $\overline{B_4}$ take the Vc level.

The biasing circuit 11 is compoised of an E-MOSFET 115 connected at its drain to Vc and receiving at its gate to the signal ACT, and an E-MOSFET 117. The E-MOSFET 116 receives at its gate a signal $\overline{ACT}$ which is obtained through inversion of the signal ACT by the inverter 114. The source of the E-MOSFET 116 is connected to the source of the E-MOSFET 115, while the drain of the same is connected to the drain of the E-MOSFET 117, as well as to the sources of the E-MOSFETs 110, 111, 112 and 113. The gate of the E-MOSFET 117 is connected to the source of the E-MOSFET 115 while the source thereof is grounded.

In the active state, i.e. in the state in which the ACT signal takes the Vc level, the E-MOSFET 102 takes the conductive state, while the E-MOSFET 102 and the E-MOSFET 103 in combination constitute an inverter circuit. Furthermore, since the E-MOSFET 115 is conductive while the E-MOSFET 116 is not conductive, the E-MOSFET 117 is turned on so that the potential of the source of the E-MOSFETs 110, 111, 112 and 113 is lowered to the ground level. Therefore, when at least one of the address information signals $A_1$ to $A_{N-2}$ takes the Vc level, the output of the N−2) input NOR gate 101 takes the ground level while the junction between the E-MOSFET 102 and the MOSFET 103 takes the Vc level. In consequence, the junction between the SD-MOSFET 104 and the E-MOSFET 105 takes the ground level. ASsume here that one, for example $B_1$, out of four signals $B_1$ to $B_4$ takes the Vc level while others take the ground level. In such a case, the SD-MOSFET 106 exhibits a low impedance. While the signal $\overline{B_1}$ takes the ground level and the E-MOSFET 110 is turned off so that the potential of the row line 21 is made at the ground level.

On the other hand, the SD-MOSFET 107, 108 and 109 exhibit high impedance so that E-MOSFETs 111, 112 and 113 are turned on to lower the potential of the row lines 22, 23 and 24 to the ground level. When all of the address information signals $A_1$ to $A_{N-2}$ take the ground level in the active state, the output from the NOR circuit 101 takes the Vc level while the junction between the E-MOSFET 102 and E-MOSFET 103 takes the ground level and the junction between the SD-MOSFET 104 and the E-MOSFET 105 takes the Vc level. Assuming here that one, e.g. $B_1$, out of the signals $B_1$ to $B_4$ takes the Vc level, the SD MOSFET 106 takes a low impedance, while the row line 21 takes the Vc level because the signal $\overline{B_1}$ takes the ground level. Since the signals $B_2$ to $B_4$ take the ground level, the SD-MOSFETs 107, 108 and 109 exhibit high impedance and, since the E-MOSFETs 111, 112 and 113 are conductive, all of the lines 22, 23 and 24 take the ground level. In consequence, the memory cell 41 is addressed out of the memory cells 41, 42, 43 and 44. Therefore, when the drain of the memory cell 41 is connected to the drain of the memory cell 41 as shown in FIG. 2, the potential of the column line 30 is held at a level near the ground level even when the electric charge is supplied to the column line 30, because the memory cell 41 is conductive. When the signal $B_3$ for example takes the Vc level, only the row line 23 takes the Vc level while other lines take the ground level. Under this state, the drain of the memory cell 43 addressed by the row line 23 is not connected to the column line 30 so that the potential of the column line 30 is increased as the latter is supplied with electric charge through a load E-

MOST $Q_L$, and the information can be read as this increase in the potential.

Then, in the power down state, i.e. when the signal ACT takes the ground level, the output of the NOR circuit 101 takes the Vc level irrespectively of the input signals $A_1$ to $A_{N-2}$ so that the E-MOSFET 102 and the E-MOSFET 103 are turned off and on, respectively, while the E-MOSFET 105 is turned off. Consequently, the junction between the SD-MOSFET 104 and the E-MOSFET 105 takes the Vc level. However, since all of the signals $B_1$ to $B_4$ take the ground level while all of the signals $\overline{B}_1$ to $\overline{B}_4$ take the Vc level, the SD-MOSFET 106, 107, 108 and 109 exhibit a high impedance, so that all of the E-MOSFETs 110, 111, 112 and 113 are turned on to lower the potential of row lines 21, 22, 23 and 24 to lower voltage. On the other hand, in the bias circuit 11, the E-MOSFET 115 is not conductive while the E-MOSFET 116 is conductive so that the drain and the source of the E-MOSFET 116 are materially short-circuitted. In this instance, a charges stored in a capacitance $C_1$ associated to the source of the E-MOST 115 and the drain of the E-MOST 116 are divided between the capacitance $C_1$ and a capacitance associated to the sources of the E-MOSTs 110 to 113. Consequently, the source potential of the E-MOSFET 110, 111, 112 and 113 is made a potential near to a divided voltage ($V_c \cdot C_2/(C_1+C_2)$) which is nearly equal to the threshold voltage of the E-MOSFET 117. In the power down state, electric current from the Vc is made to flow to the ground through the SD-MOSFET 104, SD-MOSFETs 106, 107, 108 and 109, E-MOSFETs 110, 111, 112 and 113 and then through the E-MOSFET 117. In this path of electric current, by selecting the positive threshold voltage of the E-MOSFET 117 at a level greater than the absolute value of the negative threshold voltage of the SD-MOSFETs 106, 107, 108 and 109, the SD-MOSFETs 106, 107, 108 and 109 are turned off to substantially nullify the power consumption in the power down state. In the conventional row decoder circuit shown in FIG. 1, one NOR circuit is required for driving each row line so that electric power is consumed always by $(2^N-1)$ NOR circuits. In contrast, according to the invention, one NOR circuit is used for driving a plurality of row lines (four row lines in the above embodiment) so that the number of the NOR circuits consuming the electric power is remarkably reduced.

Using N-channel silicon gate field effect transistor having a gate insulator film of 700 Å thick, 256 row decoder circuits were formed in accordance with the conventional circuit arrangement shown in FIG. 1, in which the threshold voltage of the enhancement type transistor and the threshold voltage of the depletion type transistor were selected to be 0.7 V and −3.5 V, respectively. The electric current consumed by this circuit in the active state was 85 mA. The threshold voltage of the D-MOSFET 14 in the conventional decoder circuit shown in FIG. 1 was selected to be −0.5 V. Namely, this MOSFET 14 was changed to an SD-MOSFET. In the active state, this circuit consumed a current of 45 mA.

Figure 2:
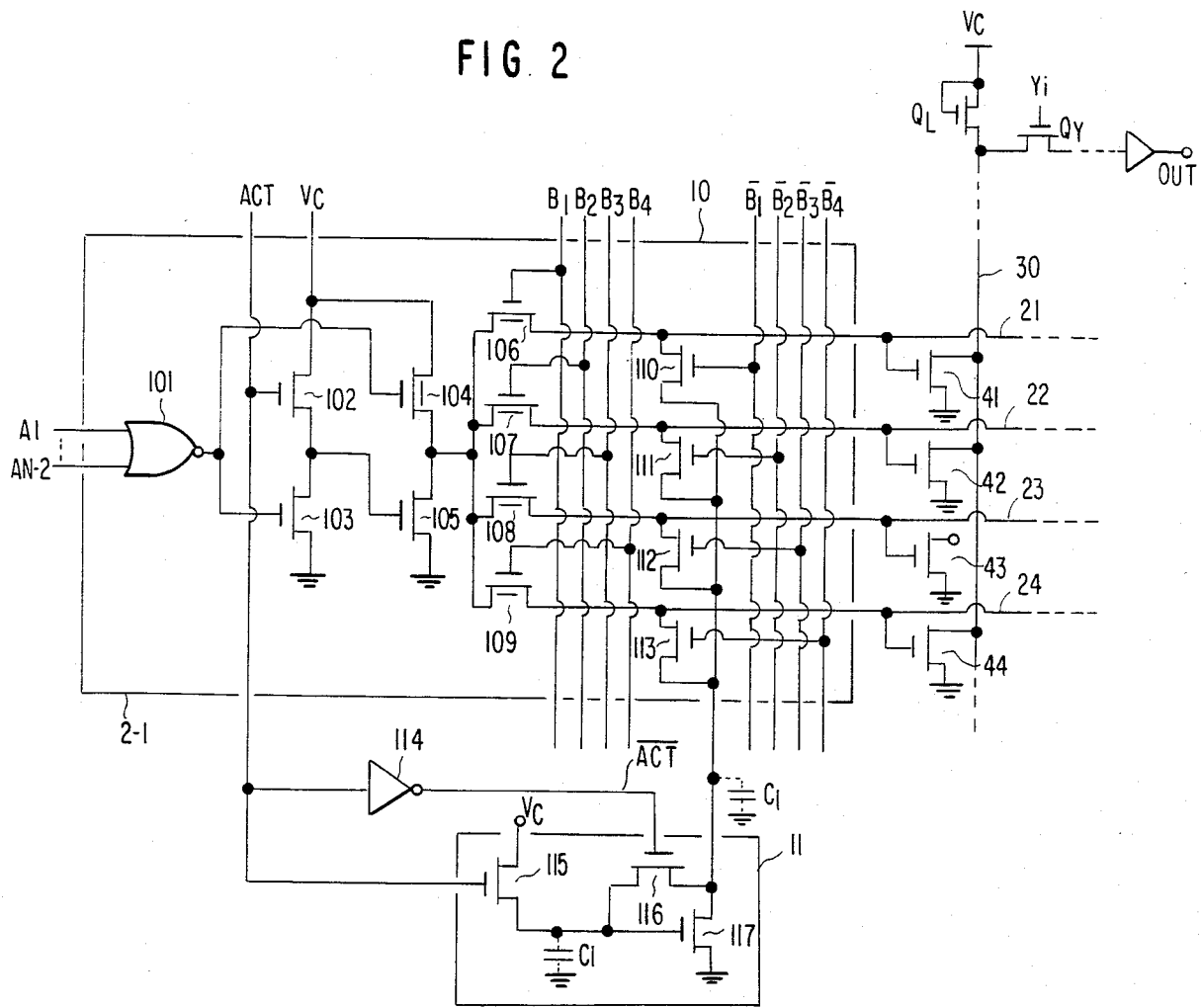
FIG. 2 is a circuit diagram of a memory circuit in accordance with an embodiment of the present invention.

An example was produced under the same condition as the latter case, in accordance with the circuit arrangement shown in FIG. 2 in accordance with the present invention. As a result of measurement, it was confirmed that the switching speed is substantially equal to that of the conventional circuit while the electric current consumption was as small as 13 mA.

As has been described, in the row decoder circuit of the invention, the power consumption in the active state is very small. In addition, in the power down state, the power consumption is zero and the level of the output is sufficiently low to eliminate any possibility of malfunction and obstruction to high-speed operation. For these reasons, the row decoder circuit of the invention is superior to the conventional row decoder circuit.

Although the foregoing description has been made with reference to the N channel MOSFETs, the present invention is applicable not only to the row decoder circuit employing the N-channel MOSFET but also to decoder circuits making use of ordinary insulated gate field effect transistor. In the circuit of the embodiment shown in FIG. 2, among N, (N−2) address information signals are used as the inputs to the NOR circuit, while the remainder two are used for the generation of signals which are to be inputted to the SD-MOSFETs and E-MOSFETs, i.e. signals $B_1$ to $B_4$ and signals $\overline{B}_1$ to $\overline{B}_4$. This method of division of the address information signals, however, is taken for the simplification of explanation and, it is to be noted that the N address information signals can be divided at any desired rate.

It is also to be noted that the invention can equally be applied to any type of RAM and ROM, although the description has been made hereinbefore with specific reference to ROM.

I claim:

1. A memory circuit comprising a plurality of row lines, a plurality of column lines, a plurality of memory cells arranged at intersections of said row lines and column lines; said plurality of row lines being divided into a plurality of row groups, each of said row groups having the same number of row lines, means for receiving a set of row address signals, a plurality of row group selection circuits each provided for the associated row group, each of said row group selection circuits generating a selection signal when the associated row group is to be selected in accordance with a first part of said row address signals, a plurality of connection circuits each provided for the associated row group, each of said circuits including a plurality of first field effect transistors each coupled between an output terminal of the row group selection circuit and the associated row line of the associated row group, a potential terminal, a plurality of second field effect transistors each coupled between the associated row line and said potential terminal, means responsive to a second part of said row address signals for conducting one of said first transistors, and means responsive to the second part of said row address signals for conducting said second transistors other than one associated to the conducted first transistor; and supply means for supplying said potential terminal with a reference potential.

2. The circuit according to claim 1, in which each of said first transistors is of a depletion type while each of said second transistors is of an enhancement type.

3. The circuit according to claim 1, in which each of said row group selection circuits includes a NOR gate receiving the first part of said row address signals and a buffer circuit receiving an output of said NOR gate.

4. The circuit according to claim 1, further comprising a mode control terminal for controlling the operation of the memory between active state and stand-by state.

5. The circuit according to claim 4, in which said supply means supplies said potential terminal with the reference potential during the active state and a potential substantially equal to the threshold voltage in absolute value of said first transistors.

6. A memory circuit comprising means for receiving a plurality of address signals, logic means receiving a part of said address signals and operatively generating an output signal when a combination of the part of said address signals is in a predetermined logic state, a plurality of selection terminals, a common node, a plurality of first switching means each coupled between said common node and the associated selection terminals, a first terminal, a plurality of second switching means each coupled between the first terminal and the associated selection teriminal, first means responsive to a second part of said address signals for selectively enabling one of said first switching means, second means responsive to the second part of said address signals for enabling said second switching means other than that associated to the enabled first switching means, third means for supplying said common node with the output signal of said logic means, fourth means for supplying said first terminal with a reference potential, a plurality of row lines, and a plurality of memory cells coupled to said row lines.

7. The circuit according to claim 6, in which each of said first switching means includes a depletion type field effect transistor.

8. The circuit according to claim 6, further comprising a second terminal for receiving a control signal for controlling operation state of the memory.

9. The circuit according to claim 8, in which said third means includes a first series circuit of third and fourth switching means, a second series circuit of fifth and sixth switching means, means for applying the output signal of said logic means to a control terminal of said fourth switching means, means for connecting a second terminal of said third switching means to said second terminal, means for connecting an intermediate junction of said first series circuit to a control terminal of said sixth switching means, means for applying the output signal of said logic means to a control terminal of said fifth switching means and means for connecting an intermediate junction of said second series to said common node.

10. The circuit according to claim 8, in which each of said first switching means includes a depletion type field effect transistor.

11. The circuit according to claim 10, in which said fourth means includes a first field effect transistor coupled between said first terminal and the reference potential, a second field effect transistor coupled between a gate of said first transistor and a power potential, a third field effect transistor coupled between said first terminal and the gate of said first transistor, means for connecting a gate of said second transistor to said second terminal, and an inverter having an input terminal coupled to said second terminal and an output terminal coupled to a gate of said third transistor.

* * * * *

UNITED STATES PATENT AND TRADEMARK OFFICE
CERTIFICATE OF CORRECTION

PATENT NO. : 4,520,463
DATED : May 28, 1985
INVENTOR(S) : Kohichiro OKUMURA

It is certified that error appears in the above-identified patent and that said Letters Patent is hereby corrected as shown below:

Column 1, line 22, "calssi" should be --classi--;

line 29, "powder" should be --power--;

line 33, "pwer" should be --power--.

Column 4, line 5, "drawin" should be --drain--.

Column 6, line 3, "compoised" should be --composed;

line 30, "ASsume" should be --Assume--.

Column 9, line 13, "teriminal" should be --terminal--.

Column 10, line 7, "second" should be --control--.

Signed and Sealed this

Eighth Day of October 1985

[SEAL]

Attest:

DONALD J. QUIGG

Attesting Officer

Commissioner of Patents and
Trademarks—Designate